United States Patent [19]

Teshima et al.

[11] Patent Number: 5,161,115
[45] Date of Patent: Nov. 3, 1992

[54] SYSTEM TEST APPARATUS FOR VERIFYING OPERABILITY

[75] Inventors: Fumiaki Teshima, Otawara; Katsuhiro Inoue; Kaoru Kurebayashi, both of Yokohama; Yukihiro Mihara, Kawasaki; Takuya Kishimoto, Kamakura, all of Japan

[73] Assignee: Kabushiki Kaisha Toshiba, Kanagawa, Japan

[21] Appl. No.: 543,371

[22] Filed: Jun. 26, 1990

[30] Foreign Application Priority Data

Sep. 12, 1989 [JP] Japan ............................ 1-236403
Sep. 12, 1989 [JP] Japan ............................ 1-236409
Dec. 22, 1989 [JP] Japan ............................ 1-333556

[51] Int. Cl.$^5$ ............................................. G06F 15/46
[52] U.S. Cl. ................................ 364/551.01; 364/580
[58] Field of Search ............... 364/578, 550, 551.01, 364/552, 200, 900, 149, 150, 152, 513; 371/24, 25.1, 27

[56] References Cited

U.S. PATENT DOCUMENTS

| | | | |
|---|---|---|---|
| 4,692,921 | 9/1987 | Dahbura et al. ................ | 371/27 |
| 4,773,028 | 9/1988 | Tallman ........................... | 364/578 |
| 4,796,194 | 1/1989 | Atherton ......................... | 364/578 |
| 4,872,126 | 10/1989 | Premerlani et al. ............. | 364/578 |
| 4,901,260 | 2/1990 | Lubachevsky ................... | 364/578 |
| 4,947,349 | 8/1990 | Munenaga et al. .............. | 364/551.01 |
| 4,967,386 | 10/1990 | Maeda et al. .................... | 364/578 |
| 4,977,531 | 12/1990 | Ogata et al. ..................... | 371/27 |

OTHER PUBLICATIONS

Encyclopedia of Computer Science and Engineering; Van Nostrand Reinhold Company; 1983; pp. 146-151, 1311-1316.

"System Design Verification Based on Formal Specifications"; Fumiaki Teshima et al., Jun. 1, 1990, pp. 1-20.

Primary Examiner—Parshotam S. Lall
Assistant Examiner—Michael Zanelli
Attorney, Agent, or Firm—Banner, Birch, McKie & Beckett

[57] ABSTRACT

A system test apparatus for verifying whether or not a tested system works according to particular specifications is disclosed. The system test apparatus comprises a storage device for storing the particular specifications as a finite state machine model including elements represented with time sections which may take place, a detecting device for periodically detecting operation information which represents an operation of the tested system as a combination of events and actions represented with the time sections which may take place and a verification device for comparing the operation information with the particular specifications stored in the storage device according to the finite state machine model. In the above finite state machine model, events, actions, and the like are represented with time sections which may take place.

6 Claims, 7 Drawing Sheets

SYSTEM TEST APPARATUS FOR VERIFYING OPERABILITY

BACKGROUND OF THE INVENTION

1. Field of the Invention and Related Art Statement

The present invention relates to a system test apparatus for automatically verifying whether or not a system works according to particular specifications.

Conventionally, when a new product is developed, a verification is conducted to determine whether or not the product's operating system works according to its design specifications.

When such a verification is conducted, test items which comprise setting data and expected values (expected information) to be output from the system in response to the given setting data are generated along a time axis. By providing the setting data to the system, the system is actually operated. After that, the verification is conducted by comparing the detected operation information of the system with the expected information along the time axis.

For example, if the system to be verified is a refrigerator, assume the following design specifications:

"When the main switch is pressed, the motor which rotates the compressor is started.

"When the voltage of the temperature sensor which measures the temperature becomes 3.12 V, the motor is stopped."

"When the voltage of the temperature sensor which measures the temperature becomes 1.57 V, the LED is lit up."

First, according to the test items which are prepared based on the design specifications, the setting data, corresponding to the main switch and the temperature sensor respectively, are generated along the time axis. Also, the expected values according to the motor and the LED are determined.

Second, the setting data is input to the refrigerator successively. The resulting the operation information of the refrigerator is detected and compared with the expected information along the time axis.

For example, in the first step, the terminal voltage of the main switch is initialized to 5 V as the setting data. Then, in the second step, the terminal voltage of the main switch is changed to 0 V thereby creating the state in which the main switch is pressed.

When the operation information obtained indicates that the motor at rest during the first step is started in the second step, the verification of the design specification "when the main switch is pressed, the motor which rotates the compressor is started" is complete.

As described above, the setting data is conventionally input to the system in sequence. Verification of whether or not the system works according to the design specifications is effected by comparing the detected operation information with the expected operation information along the time axis.

In such verification steps, due to errors involved in the detecting devices and those of sensors in the system, some information cannot be strictly defined with respect to an exact time.

For example, in a system which deals with temperature, such as a refrigerator, a state where "the temperature becomes $-21.5°$ C." is detected by a sensor. If the sensor has an error of $\pm 0.5°$ C., it is possible that the above state took place at any time when the temperature is between $-21.0°$ C. and $-22.0°$ C. That is, the time at which such state took place cannot be determined with precision.

In addition, if the system specifications have a redundancy, the system state may not be uniquely determined.

Thus, when such a system verification is automatically conducted, it is important to deal with the information containing such errors and redundancy. To date, techniques for dealing with errors and redundancies have not been achieved and automatic verification is not easily accomplished.

In the verification method described above, the verification items are created by a person using his or her knowledge and experience due to time restrictions associated with the verification. Thus, occasionally the verification items are insufficient and thereby the system tests are not satisfactorily conducted. Consequently, some errors in the system may not be found. Most of such errors are attributable to abnormal processes of the product which were not fully tested in the test phase of the product. The later such errors are found, the more expensive the repair cost becomes. Thus, it is necessary to evaluate whether or not an abnormal process is fully tested.

OBJECTS AND SUMMARY OF THE INVENTION

An object of the present invention is to provide a system test apparatus for automatically verifying whether or not the operation of a system meets its design specifications, wherein the system test apparatus takes into account errors associated with the system's detecting devices and sensors.

Another object of the present invention is to provide a system test apparatus for automatically verifying whether or not the operation of a system meets its design specifications, wherein the system test apparatus takes into account system redundancies and errors associated with the system's detecting devices and sensors.

Another object of the present invention is to provide a system test apparatus for definitely representing whether or not both a normal process of a product and its abnormal process were satisfactorily tested according to the product's design specifications represented according to a finite state machine model, for measuring a test coverage (an evaluation standard of test satisfaction reflecting the number of cases which may occur in the state), and for presenting a quantitative standard of the quality of the product.

To accomplish the above objects, the present invention is a system test apparatus for verifying whether or not a tested system works according to particular specifications. The apparatus comprises storage means for storing the specifications as a finite state machine model including an allowable error, detection means for periodically detecting operation information as a combination of possible events and actions represented with time sections, and verification means for executing the particular specifications stored in the storage means according to the finite state machine model including error information and the operation information and for verifying the operation of the tested system by checking whether or not the finite state machine is satisfied.

DETAILED DESCRIPTION OF PREFERRED EMBODIMENT

Figure 1:
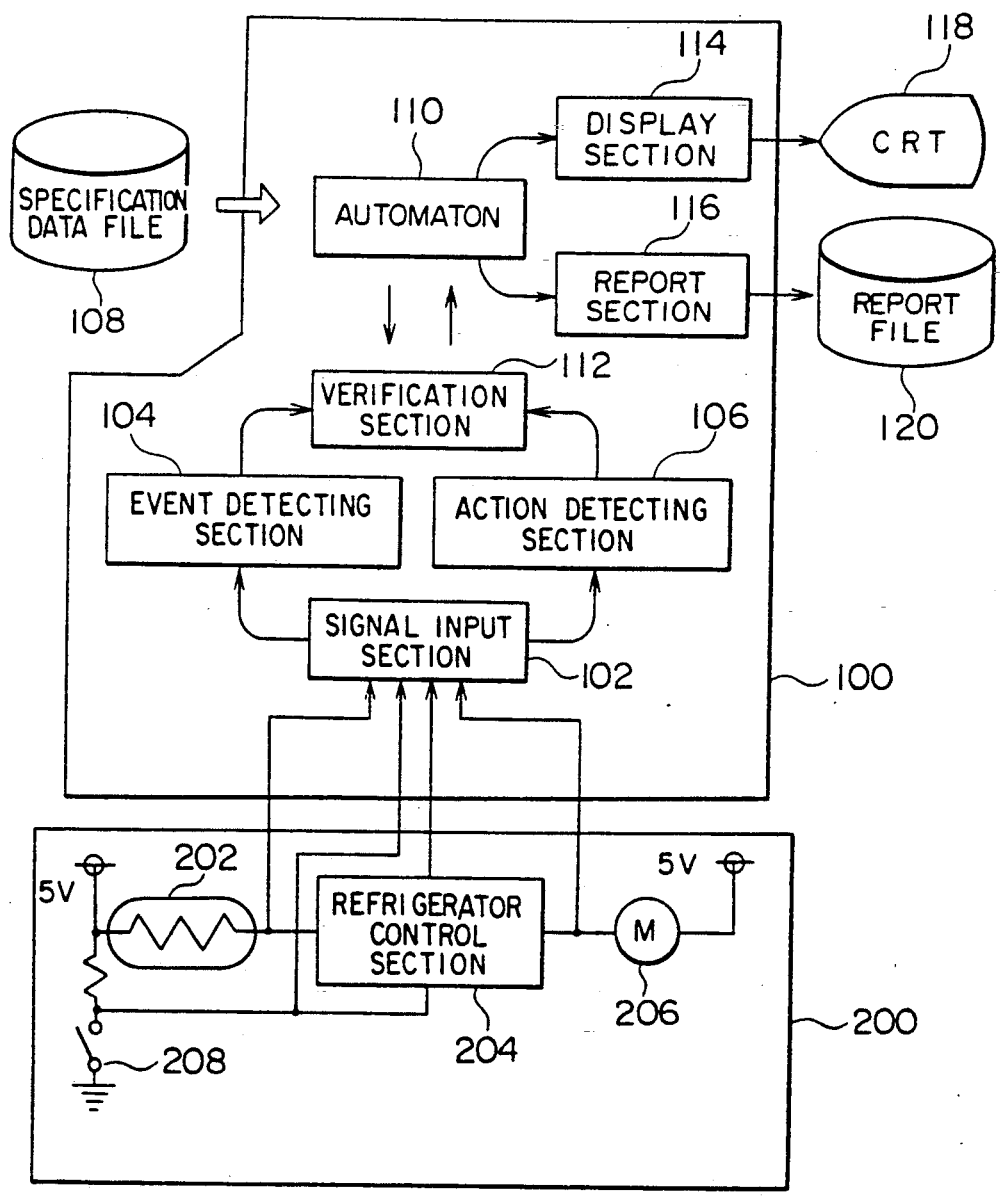
FIG. 1 is a schematic showing the structure of a system test apparatus embodying the present invention.

Now, by referring to the attached drawings, an embodiment of the present invention will be described. FIG. 1 is a block diagram showing the structure of a system test apparatus according to an embodiment of the present invention. In the figure, numeral 100 is a system test apparatus and numeral 200 is a tested system.

First, a finite state machine model which is used in the system test apparatus 100 according to the present embodiment will be described.

The finite state machine model is represented by a finite set of states and state transitions which take place by occurrence of events (input signals). In the finite state machine model, when a state transition takes place by occurrence of an event, a particular action (a particular operation in response to an input signal) takes place.

In a first embodiment, the range of measurement errors is considered and thereby times at which the above events and the above actions occur are represented as time sections rather than as time points.

In other words, the time at which an event takes place is represented as the time at which the event may occur and as the time at which the event terminates. For example, consider the following event.

(Freezer temperature) > (−21.5° C.)

This event occurs when the freezer temperature exceeds −21.5° C. This event is detected by a temperature sensor which measures the freezer temperature. However, the temperature sensor typically has a measurement error. When it is assumed that this temperature error is ±0.5° C., the above event must occur between −21° C. and −22° C.

Figure 2:
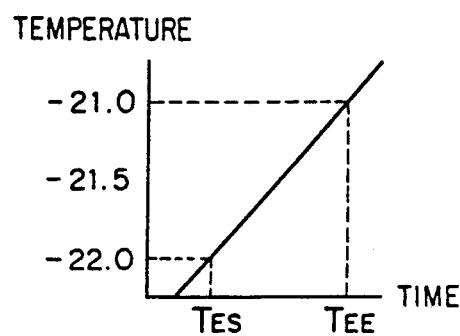
FIG. 2 is a schematic showing an example of the range of an error of a temperature sensor.
Figure 3:
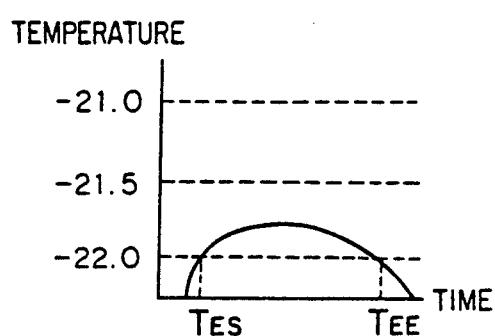
FIG. 3 is a schematic showing another example of the range of an error of a temperature sensor.

As shown in FIGS. 2 and 3, the present invention deals with such an event by recognizing the measurement error of ±0.5° C. of the temperature sensor. An occurrence time is defined as the time section (which comprises the event start time $T_{ES}$ and the event end time $T_{EE}$) in which the measurement temperature of the temperature sensor is between −21° C. and −22° C.

FIG. 3 depicts the situation where the tested system does not recognize the event "the freezer temperature is greater than −21.5° C." because the temperature does not exceed −21° C. Therefore, due to the measurement error of the temperature sensor, there is a possibility that the event could be detected even though the event does not actually occur.

Like the event, an action is also defined as a time section (time section between the action start time $T_{AS}$ and the action end time $T_{AE}$).

FIGS. 4 to 7 show various relationships between events and actions defined as time sections as described above.

Figure 4:
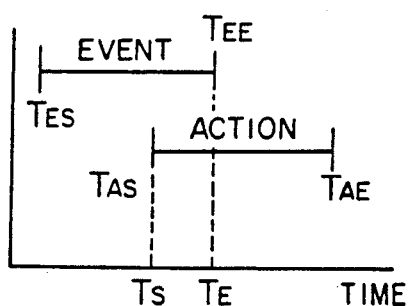
FIG. 4 is a schematic showing an example of relationship between an event and an action.
Figure 5:
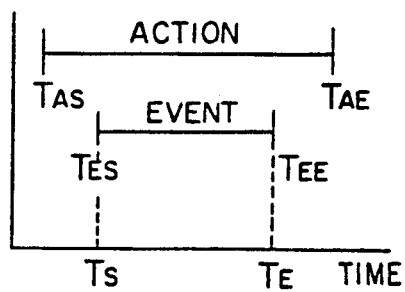
FIG. 5 is a schematic showing another example of relationship between an event and an action.

In FIGS. 4 and 5, between $T_S$ and $T_E$ are determined by ANDing the occurrence time of an event and that of an action. During the time between $T_S$ and $T_E$ the relationship between the event and the action is satisfied. In this time section, according to the occurrence of the event, the action takes place. Thus, by the relationship between the event and the action, the time at which a state transition takes place, that is, the state time, can be represented as a time section. In other words, in FIGS. 4 and 5, the time section between $T_S$ and $T_E$ is the state time.

Figure 6:
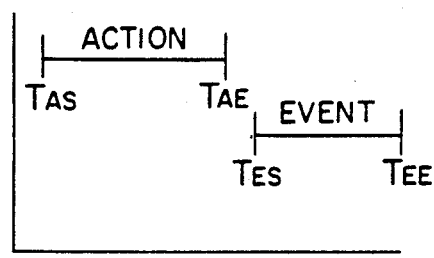
FIG. 6 is a schematic showing an example of inconsistent relationship between an event and an action.

In FIG. 6, there is no relationship between an event and an action and thus no state time exists. Accordingly, no state transition occurs. In such case, an inconsistency exists in the tested system.

Figure 7:
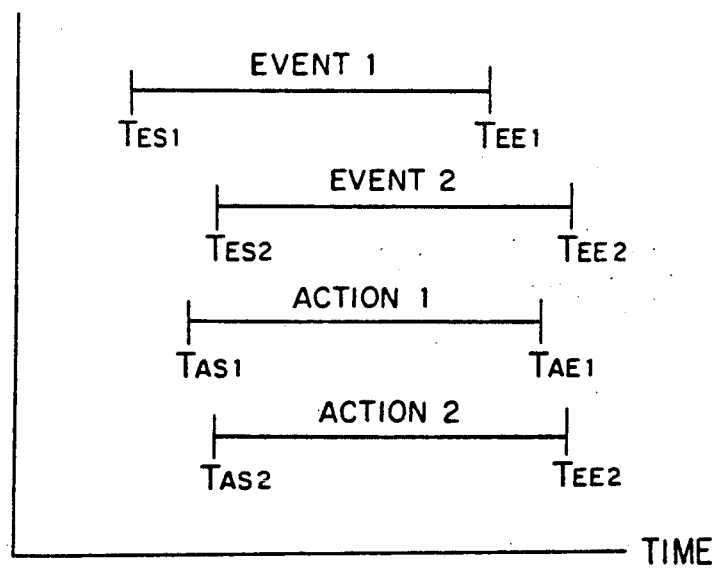
FIG. 7 is a schematic showing an example where the relationship between an event and an action is not determined.

FIG. 7 is an example where there are a plurality of sets of events and actions which may take place, and the set which first occurred is not known. In this example, there are four combinations since there are two events and two actions. Actually, when the number of combinations where combinations which are not permitted are subtracted is two or more, the set which first occurred cannot be determined, that is, an indeterminate state occurs.

In this embodiment, when the indeterminate state occurs, a particular set (which has a higher probability) is temporarily selected from available sets and then verified. If an inconsistency takes place in the course of verification, the state returns back to the indeterminate state (that is, the process backtracks). Another set comprising an event and an action is then selected and verified.

By defining events, actions, and state times as time sections, any system which has an error can be verified. In the indeterminate state, one available set comprising an event and an action is temporarily selected as operation information of the tested system. If an inconsistency later occurs, any system redundancy can be verified by backtracking to the selection step and selecting another available set as the operation information verified.

Referring to FIG. 1, an example will be described where the tested system is a refrigerator.

When the refrigerator is the tested system 200, a refrigerator control section 204 controls the rotation of a compressor drive motor 206 according to signal corresponding to the temperature of the freezer output by a temperature sensor 202. A signal from a power switch 208, temperature data measured by the temperature sensor 202, rotation data of the motor 206, and a timer signal (not shown) from the refrigerator control section 204 are output from the tested system 200 to the system test apparatus 100 as detection signals. The detection signals represent the operation of the refrigerator.

The detection signals are input to a signal input section 102 of the system test apparatus 100. Events and actions, according to the finite state machine model, are detected by an event detecting section 104 and an action detecting section 106, from the detection signals supplied by the signal output section 102, respectively.

Specifications, i.e. expected information, of the tested system 200 are stored in a specification data file 108 in a format based on the finite state machine model. Data detected by the event detecting section 104 and the action detecting section 106 is compared with the specifications in a verification section 112 according to an automaton 110 which controls the state of the tested system 200 according to the specifications stored in the specification data file 108.

The specification data, file 108 stores event data, action data, and state transition data. Each data consists of various event names, occurrence conditions, allowable error, and so forth stored in a table format.

The automaton 110 is a non-determination type automaton. As described earlier, if there are a plurality of sets of events and actions available in a particular state, the automaton 110 selects one set and verifies it. If an inconsistency occurs, it backtracks to the information selection phase and verifies another set.

The verification result of the verification section 112 is input to a display section 114 and a report section 116 through the automaton 110. The result is then displayed on a CRT 118 and stored in a report file 120.

In a system where events, actions, and state times can be precisely determined by times, redundancies can be verified in the same manner.

Now, a practical verification procedure will be described. In the following description, assume that the tested system 200 has the following specifications.

(1) When the power is turned on, the compressor is always driven.

(2) When the freezer temperature rises above $-20°$ C., the compressor is driven so as to decrease the freezer temperature.

(3) When the freezer temperature drops below $-30°$ C., the compressor is stopped so as to prevent the freezer temperature from decreasing.

(4) Once the compressor is stopped, it is not driven for 5 minutes.

(5) When the door of the freezer is open, the compressor is driven until it is closed.

Figure 8:
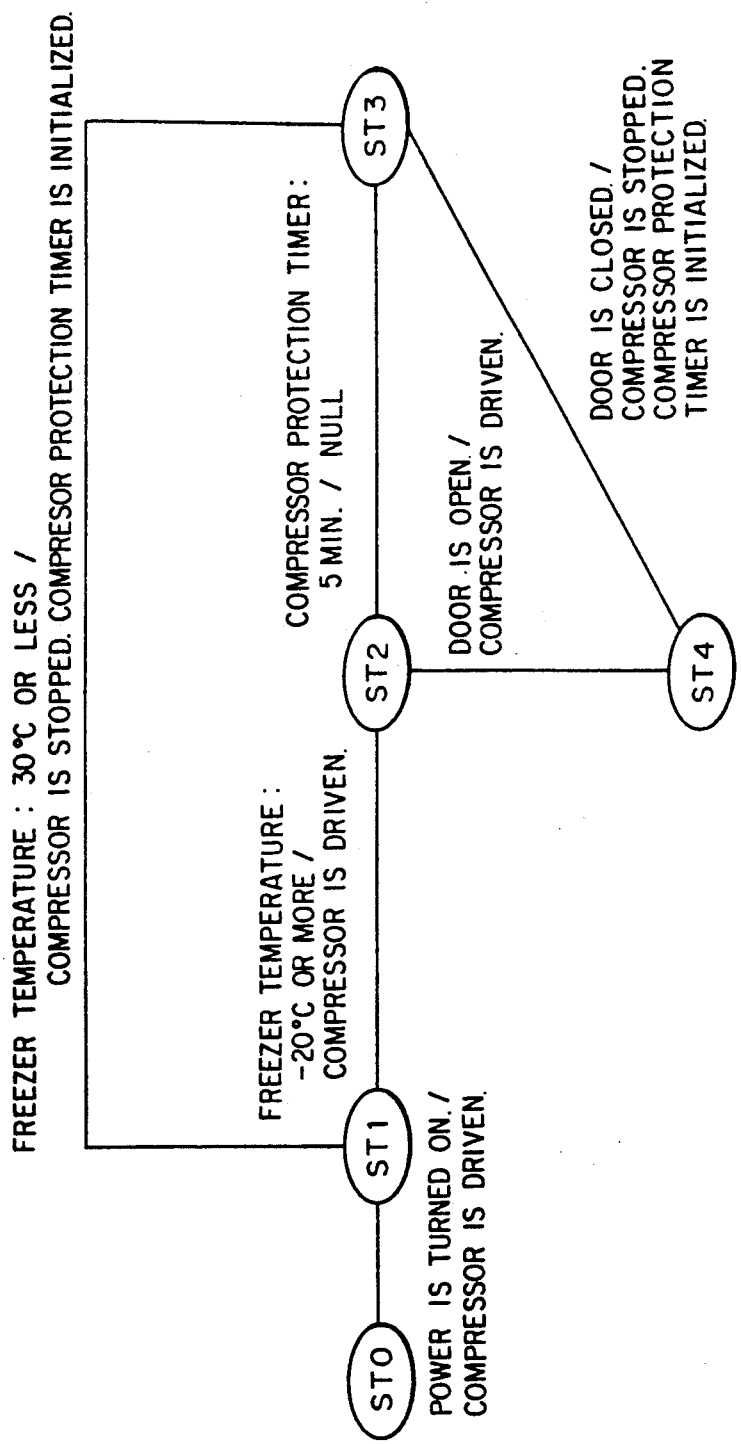
FIG. 8 is a schematic showing state transitions of the embodiment of the present invention.

The above specifications are shown by a state transition diagram in FIG. 8. By referring to FIG. 8, the verification of the refrigerator's operation will be described.

In state O (STO), the verification section 112 verifies the relationship between "Event: the power is turned on." and "Action: The compressor is driven." by comparing event data detected by the event detecting section 104 and action data detected by the action detecting section 106 with expected information stored in the specification data file 108.

When the automaton 110 determines that the relationship in STO is satisfied, the state advances to ST1.

In ST1, the relationship between "Event: Freezer temperature is less than or equal to $-30°$ C." and "Action: The compressor is stopped and the compressor protection timer is initialized." is verified. When the relationship is satisfied, the state advances from ST1 to ST3.

In ST3, from the relationship between the event and the action, the state time of ST3 is obtained. By means of the state time, "compressor protection timer = 5 minutes" is detected and the state advances to ST2. The internal timer is treated as an internal event.

In ST2, if "Event 1: Freezer temperature is greater than or equal to $-20°$ C.", "Action: The compressor is driven." is selected, then the state advances to ST1; if "Event 2: The freezer door is open.", "Action: The compressor is driven." is selected, then the process is advanced to ST4.

In ST4, if "Event: The freezer door is closed." the relationship of "Action: The compressor is stopped and the compressor protection timer is initialized." is detected and the state advances to ST3.

In ST2, assume that two combinations of "Event 1: Action" and "Event 2 Action" may occur at a given time. Therefore, the apparatus selects one of the combinations. If (Event 1 Action) is selected first, the process moves to ST1. However, if the freezer temperature does not become $-30°$ C., although the Event 2, the "door is closed" event, the "compressor is stopped" action, and so forth which have not been evaluated are considered, an inconsistency is detected due to the occurrence enable time.

In this situation, the state returns back to ST2. In ST2, "Event 2: Action" is selected and the state advances to ST4. The operation is then repeated.

In this example, since the door is open in ST2, the freezer temperature rises above $-20°$ C. Thus, it is not necessary to evaluate the event "the freezer temperature rises over $-20°$ C." This event takes place due to a redundancy of the system specifications. However, by using the present method, the redundancy can be verified.

As described above, according to the present embodiment, by defining events and actions as time sections based on the finite state machine model, any system which has errors, such as an error of the temperature sensor and an error of operation detection, can be automatically verified. When considering time sections, an error in a particular state is transferred to another state and the error becomes large in succession. However, by employing state times, since errors in states are limited, the problem of penetration of errors can be solved.

If operation information as sets of events and actions is not uniquely determined, one set is selected and verified. If an inconsistency is detected, the state returns back to the indeterminate state and another set is verified. Thus, any system which has redundancy can be automatically verified.

Figure 9:
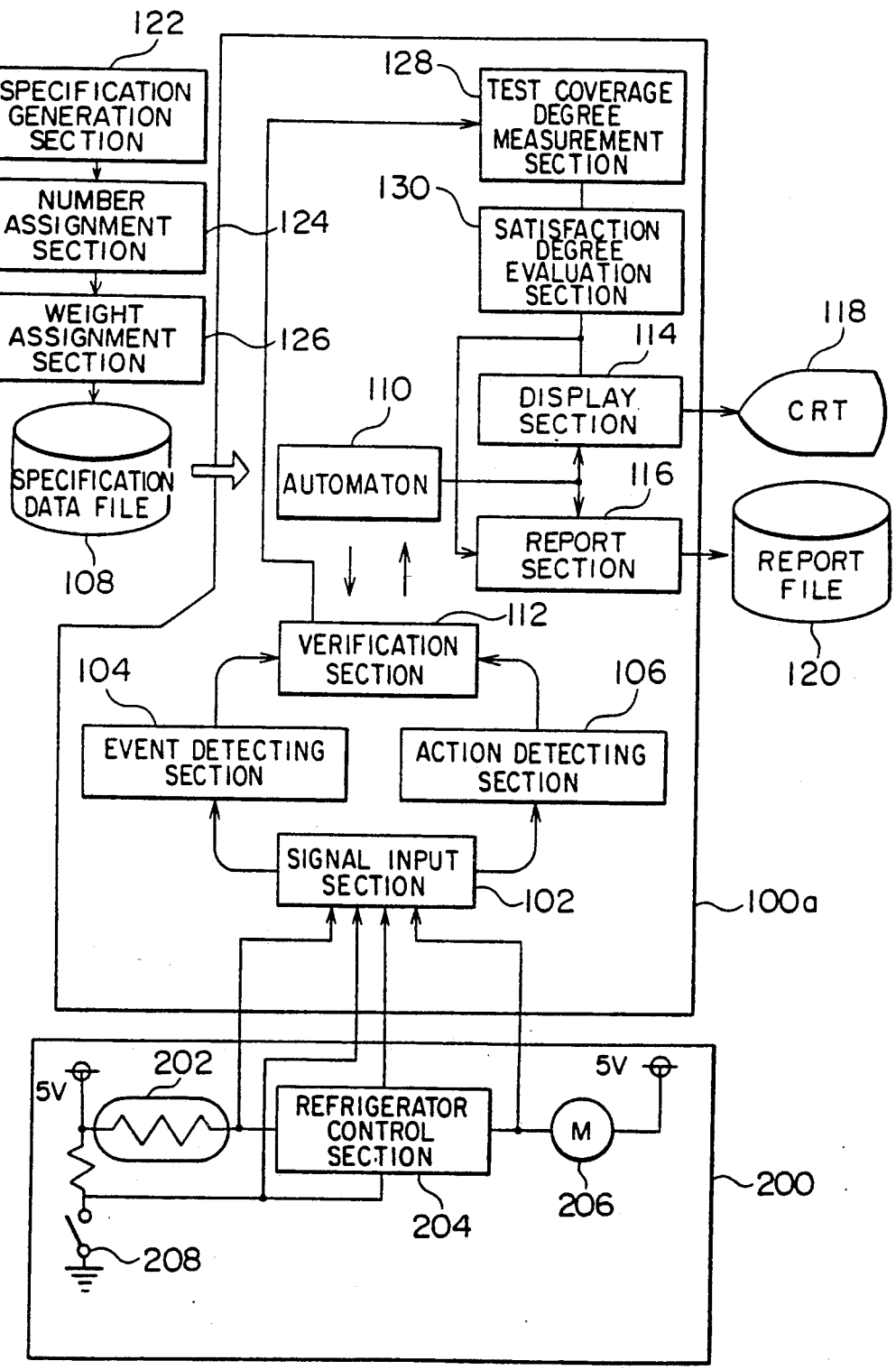
FIG. 9 is a schematic showing the structure of a system test apparatus of another embodiment according to the present invention.

Referring to FIG. 9, a system test apparatus 100a of another embodiment will be described. The system test apparatus includes test coverage degree evaluation means for measuring a test coverage of a test executed for the tested system 200.

Specifications required for the tested system 200 are generated by the specification generation section 122 in a format according to the finite state machine model.

Figure 10:
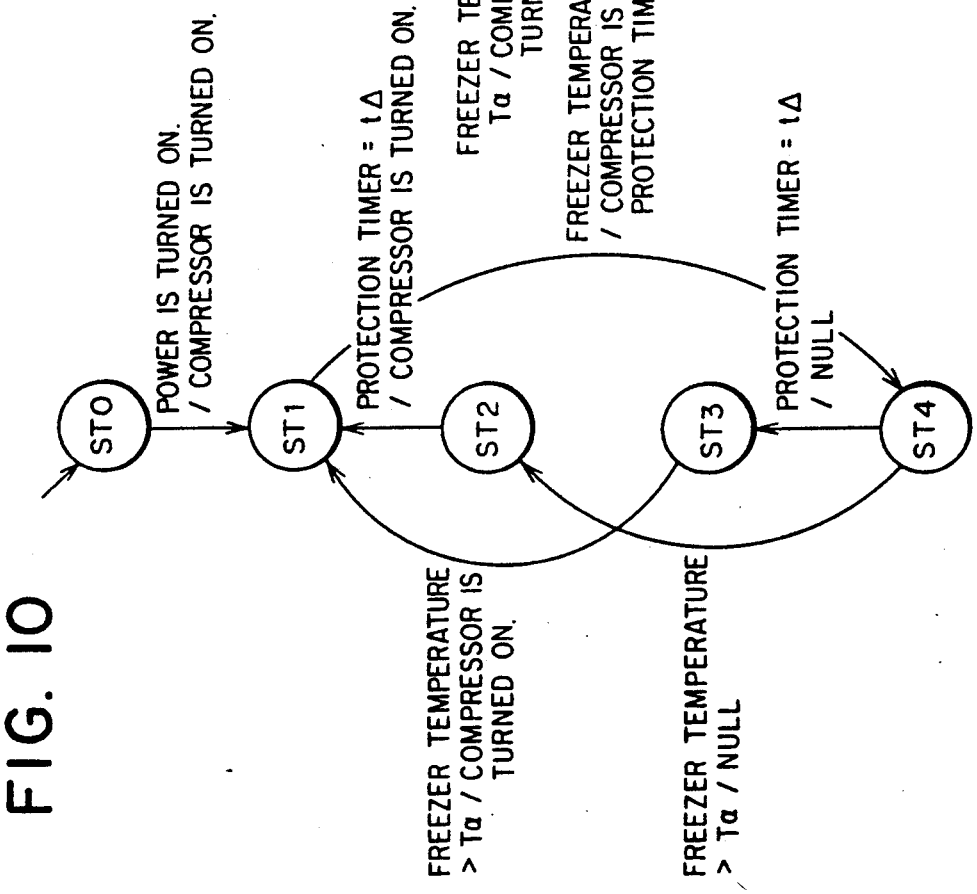
FIG. 10 is a schematic showing state transitions of the second embodiment.

For example, FIG. 10 shows an example of specifications required for a refrigerator as the tested system 200 accoording to the finite state machine model. In the figure, if an event "The power is turned on." takes place in STO, an action "Turn on the compressor." is executed and the state advances to ST1. At that time, combinations of the available functions (including single functions) of the product to be tested are represented with "states" in the finite state machine model. Thus, all the available paths from the initial state to the last state are considered in the verification process. These paths are composed of normal process operations and abnormal process operations.

A number assignment section 124 assigns identification numbers to each state and state transition derived from the specifications according to the finite state machine model provided by a specification generation section 122. For example, in FIG. 10, identification numbers are assigned as follows: "1" to ST0, "2" to ST1, ..., "6" to the state transition from ST0 to ST1.

After the identification numbers are assigned to each state and state transition, a weight assignmnent section 126 weights the states and the state transitions. In other words, the weight assignment section 126 determines whether the states and state transitions structure a normal process operation or an abnormal process operation and weights them according to the determined results.

Figure 11:
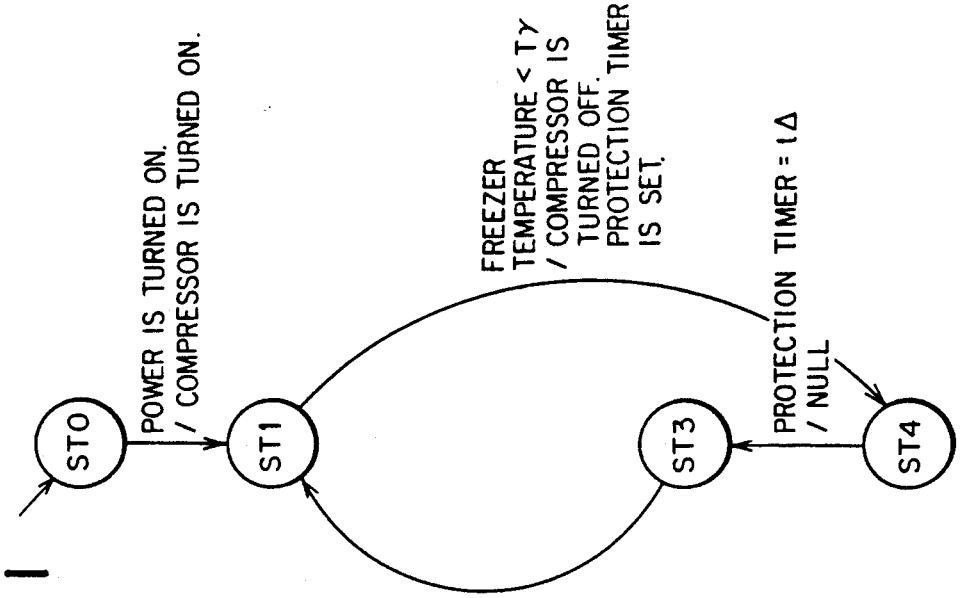
FIG. 11 is a schematic showing state transitions of a normal process operation of FIG. 10.
Figure 12:
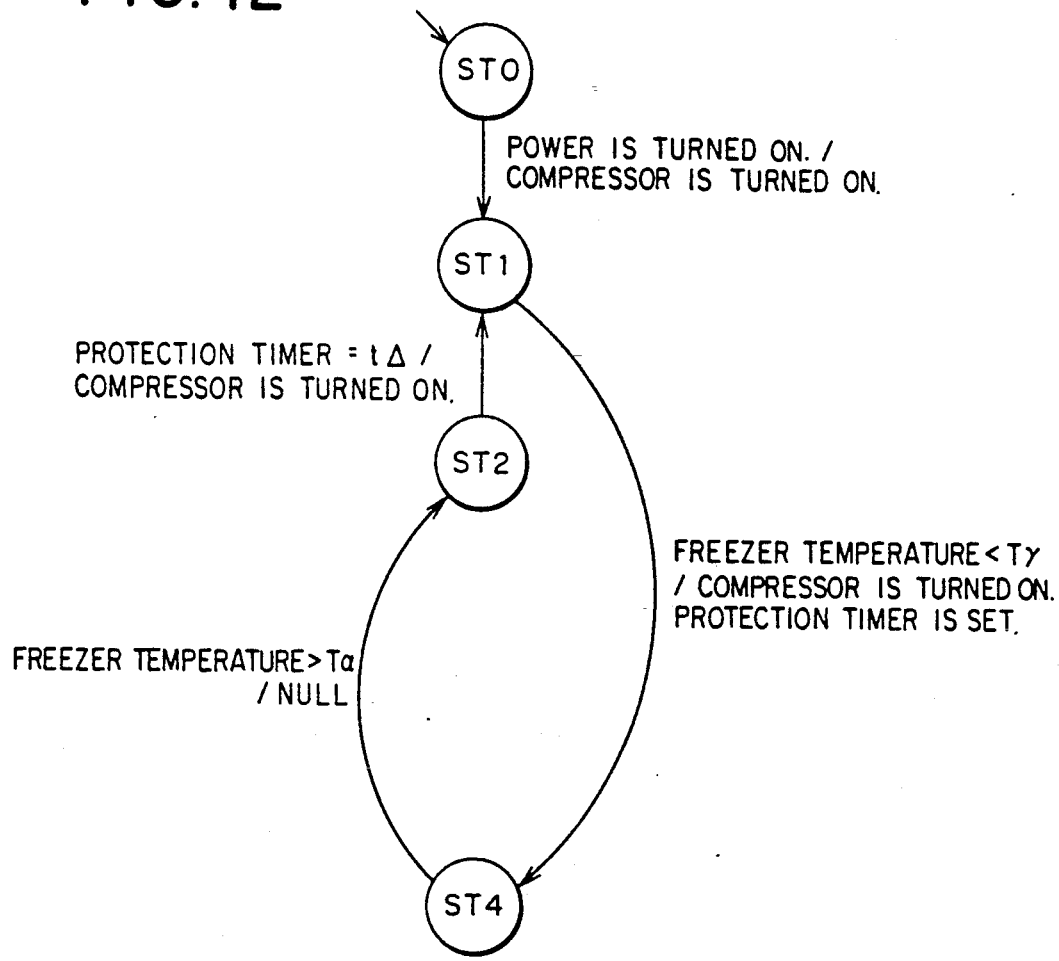
FIG. 12 is a schematic showing state transitions of an abnormal process operation of FIG. 10.

FIG. 11 shows an example of a normal process operation where the specifications shown in FIG. 10 are ambiguous. On the other hand, FIG. 12 shows an example of an abnormal process operation where the specifications shown in FIG. 10 are ambiguous. In the normal operation of the refrigerator, the compressor protection timer never becomes $t\Delta$ before the freezer temperature rises above $T\alpha$. Thus, the example shown in FIG. 12 represents an abnormal process operation. In a special case, such that "the refrigerator door is kept open", the path shown in FIG. 12 is taken. The chance of testing this case is very small. Thus, the states and the state transitions which form the normal process operation shown in FIG. 11 are positively weighted. In contrast, the states and the state transitions which form the abnormal process operation shown in FIG. 12 are negatively weighted.

Moreover, real products have errors, for example a temperature error caused by a temperature sensor. Thus even if only a single state logically exists, there are actually a plurality of states. It is therefore necessary to weight all cases which may take place in any situation.

Figure 13:
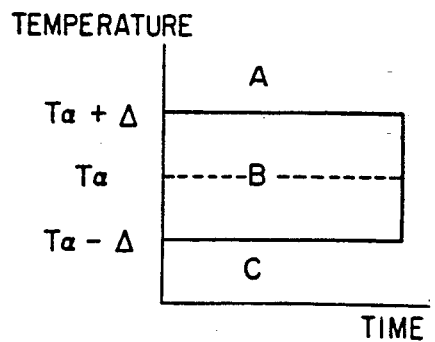
FIG. 13 is a schematic showing a temperature range of a verification.

For example, in FIG. 10, since there is an event "Freezer temperature $<T$ in ST1, a path to ST4 is logically possible. However, if there is an error of $\pm\Delta$ due to the operation of the temperature sensor which measures, it is necessary to test the path from the state 1 to state 4 for the three states of the temperature ranges A, B, and C shown in FIG. 13.

Although not included in the example of FIG. 10, the operation of the refrigerator may further include two events, such as "The rapid freezing button is turned on." and "The defrosting button is turned on.", that may occur simultaneously. In this situation, the following three cases should be tested (1) "when only the rapid freezing button is turned on", (2) "when only the defrosting button is turned on", and (3) when both the rapid freezing button and the defrosting button are turned on." The number of possible cases in a given situation is set as a denominator. The situation is weighted so that when all the cases are tested, the total of all the cases becomes "1".

An example for weighting of the abnormal process operation shown in FIG. 12 will not be described. The states and the state transitions which are present in common with the normal process operation are positively weighted, while those which are present in common with the abnormal process operation are negatively weighted.

For example, ST0 is weighted with "1"; each of ST1 and ST4 is weighted with "⅓", "⅓", and "⅓" due to three cases which exist because of the measurement error of the temperature sensor; and ST2 is weighted with "−1".

In addition, the state transition from ST1 to ST1 and that from ST1 to ST4 are weighted with "1", while the state transition from ST4 to ST2 and that from ST2 to ST1 are weighted with "−1".

The product specifications are represented according to the finite state machine model. The number assignment section 124 assigns the identification numbers and the weight assignment section 126 assigns weights. The data is stored in the specification data file 108 in a table format, for example, as event data, which consists of various event names, occurrence mode, allowable error, and so forth, action data, and state transition data.

In this embodiment, a detection signal from the tested system 200 is input to the signal input section 102. Events and actions are detected according to the finite state machine model by the event detecting section 104 and the action detecting section 106, respectively, from the detection signals input to the signal input section 102. The detected data is compared with the expected information by the verification section 112 and verified by the automaton 110 which controls the state of the tested system 200 according to the specifications stored in the specification data file 108.

The verified result in the verification section 112 is output to the display section 114 and the report section 116 through the automaton 110. In addition, the result is displayed on the CRT display 118 and stored in the report file 120.

The verification data is sent to the test coverage degree measurement section 128. The test coverage degree measurement section 128 measures whether or not and the number of times the normal process operation and the abnormal process operation occur. This is information is provided in terms of the identification number which is assigned to "states" and "state transitions" by the number assignment section 124. In addition, the test coverage degree measurement section 128 determines the number of possible cases. In this manner, the test coverage degree measurement section 128 quantitatively measures how many verification items of the tested system 200 have been executed.

After the verification is completed, the number of the "states" passed and the number of "state transitions" passed which are measured by the test coverage degree measurement section 128 are sent to the satisfaction degree evaluation section 130. The satisfaction degree of the verification being executed is evaluated according to the weighted values assigned by the weight assignment section 126. The evaluation is executed according to the following equation programmed in the satisfaction degree evaluation section 130.

Number of states (number of state transitions) being passed/Number of states (number of state transitions) to be passed.

Now, by using the weighted values assigned to the specification description the example shown in FIG. 12 will be evaluated. To simplify the evaluation, it is assumed that the number of "states" passed and the number of "state transitions" passed are 1 respectively. Thus, the normal state test coverage degree and the abnormal state transition test coverage degree of the states and the state transitions forming the normal process operation are represented as $(1+1+1)/3=1$ and $(1=1)/2=1$, respectively. On the other hand, the abnormal state test coverage degree and the abnormal state transition test coverage degree of the states and the state transitions forming the abnormal process operation are represented as $(-1)/1=-1$ and $(-1-1)/2=-1$, respectively.

According to the standard of the evaluation, the best grade of the above four types of test coverage degrees is 100%. In the above example, it is evaluated that the verification being executed has no omissions.

The evaluation result determined by the satisfaction degree evaluation section 130 is output to the display section 114 and the report section 116 as is the verification result by the verification section 112. The evaluation result is also displayed on the CRT display 118 and stored in the report file 120.

Now, the operation of the system test apparatus 100a will be described.

Assume that a refrigerator has the following specifications.

(1) When the power is turned on, the compressor is always driven.

(2) When the freezer temperature drops below T$\gamma$, the compressor is stopped until the freezer temperature rises.

(3) When the freezer temperature rises above T$\alpha$, the compressor is drive so as to lower the freezer temperature.

(4) Once the compressor is stopped, the compressor is not driven for t$\Delta$.

FIG. 10 shows the above specifications according to the finite state machine model. FIGS. 11 and 12 show the normal process operation and the abnormal process operation of FIG. 10, respectively. Now, by referring to FIGS. 11 and 12, the operation of the refrigerator will be described.

In the normal process operation (shown in FIG. 11), in STO (the intitial state) where the refrigerator waits until the power is turned on, the verification section 112 compares event data and action data which are detected respectively by the event detecting section 104 and the action detecting section 106 with the expected information stored in the specification data file 108 so as to verify the relationship between "Event: The power is turned on." and "Action: Drive the compressor."

When the automaton 110 determines that the relationship between the event and the action is satisfied in ST0, the state advances to ST1. The verification data of the verification section 112 is sent to the test coverage degree measurement section 128. The number of "states" passed and the number of "state transitions" passed are measured according to the identification number assigned by the number assignment section 124. The verification conducted by the verification section 112 and the measurement of the number of states passed and the number of state transitions passed conducted by the test coverage degree measurement section 128 are similarly executed in each state that follows.

In ST1, the relationship between "Event: Freezer temperature $<$T$\gamma$" and "Action: Stop the compressor and initialize the compressor protection timer." is verified with the detection error of the temperature sensor taken into account. When the relationship is satisfied, the state advances to ST4.

In ST4, when "Event: Protection timer=t$\Delta$" is detected by the protection timer in the refrigerator control section 204, the state advances to ST3.

In ST3, the relationship between "Event: Freezer temperature$<$T$\alpha$" and "Action: Drive the compressor." is verified with the detection error of the temperature sensor taken into account ST1 above. After that, the state advances to ST1 and this operation is repeated.

Then, in the abnormal process operation (shown in FIG. 12), the operation from ST0 to ST4 is the same as that of the normal process operation described above. However, in ST4, if an abnormal situation where the refrigerator door is kept open occurs, before the event "protection timer=t$\Delta$" is detected, "Event: Freezer temperature$>$T$\alpha$, is detected. When the event "Freezer temperature$>$T$\alpha$" is detected, the state advances to ST2.

In ST2, the relationship between the "Event: Protection timer=t$\Delta$" and "Action: Drive the compressor." is verified. When the compressor is driven again time t$\Delta$ later, the state advances to ST1. When the refrigerator door is kept open, the entire operation from ST1 to ST2 is repeated. However, if the refrigerator door is closed during the operation, the state returns back to the normal process operation routine.

After the above operation is executed and all the verification items are verified, the satisfaction degree evaluation section 130 evaluates the satisfaction degree of the verification executed. This is accomplished by evaluating the number of states passed and the number of state transitions passed by the test coverage degree measurement section 128 according to the weighted values assigned by the weight assignment section 126. The following equation is used and the evaluation result is output.

Number of states (number of state transitions) being passed/Number of states (number of state transitions) to be passed.

There is an evaluation standard of the test coverage degree that follows.

P0: State test coverage
... The ratio of states being passed against all states
--> The best grade of the state test coverage is +100%.

T0: State transition test coverage degree
... The ratio of state transitions being passed against all state transitions
--> The best grade of the state transition test coverage is +100%.
: Average state passing degree
... The average number of states being passed
--> The larger the degree, the better the grade.
: Average state transition passing degree
... The average number of state transitions being passed
--> The larger the degree, the better the grade.

P11: Normal state test coverage degree
... The ratio of states being passed against all states structuring the normal process operation
--> The best grade of the normal state test coverage state is +100%.

T11: Normal state transition test coverage degree
... The ratio of state transition being passed against all state transitions structuring the normal process operation.
--> The best grade of the normal state transition test coverage degree is +100%.

P12: Abnormal state test coverage degree
... The ratio of states being passed against all states structuring the abnormal process operation.
--> The best grade of the abnormal state test coverage degree is −100%.

T12: Abnormal state transition test coverage degree
... The ratio of state transitions being passed against all state transitions structuring the abnormal process operation.

-continued

```
-->  The best grade of the abnormal state transition test
     coverage degree is -100%.
P1: Overall state test coverage degree
...  Total of normal state test coverage degree and
     abnormal state test coverage degree
-->  The best grade of the overall state test coverage
     degree is 0.
T1: Overall state transition test coverage degree
...  Total of normal state transition test coverage degree
     and abnormal state transition test coverage degree.
-->  The best grade of the overall state transition test
     coverage degree is 0.
P21: Normal case test coverage degree
...  The number of cases being passed against the number
     of cases which may take place in all the states
     structuring the normal process operation.
-->  The best grade of the normal case test coverage
     degree is +100%.
P22: Abnormal stae test coverage degree
...  The number of cases being passed against the number
     of cases which may take place in all the states
     structuring the abnormal process operation.
-->  The best grade of the abnormal case test coverage
     degree is -100%.
P2: Overall case test coverage degree
...  Total of normal case test coverage degree and
     abnormal case test coverage degree.
-->  The best grade of the overall case test coverage
     degree is 0.
```

As described above, according to the present embodiment, combinations of available functions (including single functions) of the tested system can be represented with states and state transitions in a finite state machine model. Thus, all the available paths from the initial state to the last state of the tested system can be determined as verification items. In addition, the coverage of each verification item can be quantitatively determined. Consequently, omissions of the verification items can be checked and the test satisfaction degree of the product quality can be objectively evaluated from various views.

In addition, since the progress state of each test step can be determined according to the product specifications, the test coverage of the product specifications can be precisely measured.

What is claimed is:

1. In a system test apparatus for verifying whether a tested system operates according to specifications including event information and action information, the improvement comprising:

storage means for storing the specifications as a finite state machine model including allowable errors associated with the event and action information;

detection means for detecting operation information of the tested system as events and actions;

verification means for verifying the operation of said tested system, said verification means including controlling means for controlling said tested system according to the specifications stored in said storage means and comparing means for comparing said operation information with said specifications stored in said storage means to determine whether the detected operation information occurs within the allowable errors associated with the event and action information.

2. The system test apparatus set forth in claim 1, further comprising:

specification generation means for representing said specifications of said tested system as states and state transitions according to said finite state machine model;

number assignment means for assigning identification numbers to the states and state transitions in the specifications generated by said specification generation menas;

weight assignment means for weighting said states and said state transitions according to a normal operation and an abnormal operation in said tested system;

test coverage degree measurement means for measuring said states and said state transitions completed by said tested system under the control of said controlling means according to said identification numbers assigned thereto; and satisfaction degree evaluation means for evaluating the satisfaction of the verification executed by said verification means by evaluating the test coverage degree measurement means according to the weighted states and state transitions.

3. In a system test apparatus for verifying whether a tested system operates according to particular specifications including event information and action information associated with the event information, the improvement comprising:

storage means for storing the specifications as a finite state machine model including allowable errors associated with the event and action information;

detection means for detecting operation information of the tested system as events and actions;

specification execution means for receiving said operation information, for selecting an estimated state of said tested system by means of said operation information, and for executing a finite state machine model according to the selected state of said tested system; and verification means for verifying the operation of said tested system, said verification means including comparing means for comparing said operation information with said specifications according to said finite state machine model executed by said specification execution means to determine whether the detected operation information is within the allowable errors associated with the event and action information, wherein said specification execution means selects a further state of said tested system if said comparing means determines that the operation information is not within the allowable errors and executes the finite state machine model according to the further state, and wherein said comparing means compares said operation information with said specifications according to said finite state machine model executed according to the further state to determine whether the detected operation information is within the allowable errors associated with the event and action information.

4. The system test apparatus according to claim 3, further comprising:

specification generation means for representing said specifications of said tested system as states and state transitions according to said finite state machine model;

number assignment means for assigning identification numbers to the states and state transitions in the specifications generated by said specification generation means;

weight assignment means for weighting said states and said state transistions according to a normal operation and an abnormal operation in said tested system;

test coverage degree measurement means for measuring said states and said state transitions executed by said specification execution means according to said identification numbers assigned thereto; and satisfaction degree evaluation means for evaluating the satisfaction of the verification executed by said verification means by evaluating the test coverage degree measurement means according to the weighted states and state transitions.

5. In a system test apparatus for verifying whether a tested system operates according to specifications including event information and action information associated with the event information, the improvement comprising:

specification generating means for representing said specifications of said tested system as states and state transitions according to said finite state machine model;

number assignment means for assigning identification numbers to the states and state transitions in the specifications generated by said specification generating means;

weight assignment means for weighting said states and said state transitions according to a normal operation or an abnormal operation in the tested system;

verification means for verifying whether said tested system operates according to said specifications represented according to said finite state machine model;

test coverage degree measurement means for measuring said states and said state transitions verified by said verification means according to the identification numbers assigned thereto; and satisfaction degree evaluation means for evaluating the satisfaction of the verification performed by said verification means by evaluating the test coverage degree measured by said test coverage degree measurement means according to the weighted states and state transitions.

6. A system test apparatus for verifying whether a tested system operates according to specifications including event information, action information associated with the event information, and state transition information, said apparatus comprising:

storing means for storing the specifications as a finite state machine model wherein the event and the action information include corresponding event and action time intervals during which the occurrence of the respective events and actions are possible;

detecting means for detecting operating information of the tested system the operating information including event detections and action detections;

control means for controlling said tested system in accordance with the specifications stored in said storing means; and a verification section, said verification section including comparing means for comparing the detected operating information and the specifications stored in said storing means and verifying means responsive to said comparing means for verifying the operation of said tested system if an action occurs during a state time determined by an overlapping of corresponding event and action time intervals.

* * * * *